(12) United States Patent
Chapman et al.

(10) Patent No.: US 7,677,429 B2
(45) Date of Patent: *Mar. 16, 2010

(54) CONCAVE FACE WIRE BOND CAPILLARY AND METHOD

(75) Inventors: Gregory M. Chapman, Meridian, ID (US); Michael J. Bettinger, Eagle, ID (US); Jennifer A. Due, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/196,696

(22) Filed: Aug. 22, 2008

(65) Prior Publication Data

US 2008/0302862 A1 Dec. 11, 2008

Related U.S. Application Data

(63) Continuation of application No. 11/246,353, filed on Oct. 7, 2005, now Pat. No. 7,416,107, which is a continuation of application No. 10/624,796, filed on Jul. 22, 2003, now Pat. No. 6,966,480, which is a continuation of application No. 10/155,317, filed on May 23, 2002, now Pat. No. 6,595,406, which is a continuation of application No. 09/940,203, filed on Aug. 27, 2001, now Pat. No. 6,439,450, which is a continuation of application No. 09/649,209, filed on Aug. 28, 2000, now Pat. No. 6,311,890, which is a continuation of application No. 09/162,649, filed on Sep. 29, 1998, now Pat. No. 6,158,647.

(51) Int. Cl.
*B23K 37/00* (2006.01)
*B23K 31/02* (2006.01)

(52) U.S. Cl. ..................... 228/4.5; 228/180.5

(58) Field of Classification Search ............. None
See application file for complete search history.

(56) References Cited

U.S. PATENT DOCUMENTS

| | | | |
|---|---|---|---|
| 3,087,239 A | 4/1963 | Clagett |
| 3,643,321 A | 2/1972 | Field et al. |
| 3,894,671 A | 7/1975 | Kulicke, Jr. et al. |
| 4,030,657 A | 6/1977 | Scheffer |
| 4,327,860 A | 5/1982 | Kirshenboin et al. |
| 4,415,115 A | 11/1983 | James |
| 4,434,347 A | 2/1984 | Kurtz et al. |
| 4,513,190 A | 4/1985 | Ellett et al. |
| 4,778,097 A | 10/1988 | Hauser |
| 4,877,173 A | 10/1989 | Fujimoto et al. |
| 4,886,200 A | 12/1989 | Tsumura |
| 4,974,767 A | 12/1990 | Alfaro et al. |
| 5,003,373 A | 3/1991 | Tsumura et al. |
| 5,148,959 A | 9/1992 | Cain et al. |
| 5,172,851 A | 12/1992 | Matsushita et al. |
| 5,217,154 A | 6/1993 | Elwood et al. |

(Continued)

*Primary Examiner*—Kiley Stoner
(74) *Attorney, Agent, or Firm*—TraskBritt

(57) ABSTRACT

An improved wire bonding capillary used in the bonding of wires to the bond pads of a semiconductor device and the leads of a lead frame, the wire bonding capillary having a working tip having a working surface including a flat annular portion surrounding the wire feed aperture in the capillary and a concave surface extending therefrom to the intersection with the radius extending from the external tip diameter of the working tip.

9 Claims, 6 Drawing Sheets

U.S. PATENT DOCUMENTS

| | | |
|---|---|---|
| 5,302,550 A | 4/1994 | Hirota et al. |
| 5,421,503 A | 6/1995 | Perlberg et al. |
| 5,425,491 A * | 6/1995 | Tanaka et al. ............... 228/44.7 |
| 5,437,405 A | 8/1995 | Asanasavest |
| 5,445,306 A | 8/1995 | Huddleston |
| 5,465,899 A | 11/1995 | Quick et al. |
| 5,485,949 A | 1/1996 | Tomura et al. |
| 5,516,029 A | 5/1996 | Grasso et al. |
| 5,544,804 A | 8/1996 | Test et al. |
| 5,558,270 A | 9/1996 | Nachon et al. |
| 5,603,445 A | 2/1997 | Hill et al. |
| 5,662,261 A | 9/1997 | Fogal |
| 5,868,301 A * | 2/1999 | Distefano et al. ...... 228/180.21 |
| 5,871,141 A | 2/1999 | Hadar et al. |
| 5,884,830 A | 3/1999 | Yamazaki et al. |
| 5,891,796 A | 4/1999 | Nakamura et al. |
| 5,931,368 A | 8/1999 | Hadar et al. |
| 5,938,105 A | 8/1999 | Singh |
| 5,984,162 A | 11/1999 | Hortaleza et al. |
| 6,041,995 A | 3/2000 | Takahashi et al. |
| 6,065,667 A * | 5/2000 | Singh ....................... 228/180.5 |
| 6,158,647 A | 12/2000 | Chapman et al. |
| 6,213,378 B1 * | 4/2001 | Singh ....................... 228/110.1 |
| 6,311,890 B1 | 11/2001 | Chapman et al. |
| 6,371,356 B1 | 4/2002 | Senuma |
| 6,439,450 B1 | 8/2002 | Chapman et al. |
| 6,595,406 B2 | 7/2003 | Chapman et al. |
| 6,966,480 B2 | 11/2005 | Chapman et al. |

* cited by examiner

CONCAVE FACE WIRE BOND CAPILLARY AND METHOD

CROSS-REFERENCE TO RELATED APPLICATIONS

This application is a continuation of application Ser. No. 11/246,353, filed Oct. 7, 2005, now U.S. Pat. 7,416,107, issued Aug. 26, 2008, which is a continuation of application Ser. No. 10/624,796, filed Jul. 22, 2003, now U.S. Pat. 6,966,480, issued Nov. 22, 2005, which is a continuation of application Ser. No. 10/155,317, filed May 23, 2002, now U.S. Pat. 6,595,406, issued Jul. 22, 2003, which is a continuation of application Ser. No. 09/940,203, filed Aug. 27, 2001, now U.S. Pat. 6,439,450, issued Aug. 27, 2002, which is a continuation of application Ser. No. 09/649,209, filed Aug. 28, 2000, now U.S. Pat. 6,311,890, issued Nov. 6, 2001, which is a continuation of application Ser. No. 09/162,649, filed Sep. 29, 1998, now U.S. Pat. 6,158,647, issued Dec. 12, 2000.

BACKGROUND OF THE INVENTION

Field of the Invention

The invention relates to semiconductor manufacturing. More particularly, the invention relates to an improved wire bonding capillary used in the bonding of wires to the bond pads of a semiconductor device and the leads of a lead frame.

In semiconductor device manufacturing, a wire bonding process is used to electrically connect the metal bond pads on the active surface of a semiconductor die to the leads or lead fingers of a lead frame. Wire bonding devices are well known in the art. U.S. Pat. Nos. 3,894,671, 4,877,173, and 5,217,154 illustrate wire bonding devices.

The wire bonding process occurs during the final stages of manufacture of the semiconductor device before the semiconductor device is enclosed within a sealed or encapsulated package. Although a variety of different packaging systems are used, most packaging systems include a lead frame on which the semiconductor die is mounted. The lead frame has lead fingers which are connected to the bond pads on the active surface of the semiconductor die through the use of wires bonded to the lead fingers and bond pads. Subsequently, the semiconductor die, wires, and portions of the lead fingers and lead frame are encapsulated in plastic during a molding process. After the molding process, the portions of the lead fingers extending beyond the molded plastic material are trimmed and formed into the desired configuration for the use and mounting of the semiconductor device on a substrate.

The wires used to connect the bond pads of the semiconductor die to the lead fingers of the lead frame are small in diameter, have as short a length as possible, and are typically of gold. During the wire bonding process, a heat block heats the semiconductor die and the lead frame to a temperature in the range of 150° C. to 350° C. A bonding capillary tool mechanically presses the wire against a bond pad on the active surface of the semiconductor die and then to a bonding site on the desired lead finger of the lead frame. The bond wire is threaded through the bonding capillary for use in the bonding process. The end of the wire threaded through the bonding capillary is then heated by an electrical discharge or a hydrogen torch to a molten state, thereby forming a ball of molten material on the end of the bond wire extending from the bonding capillary. The molten ball is pressed by the bonding capillary against the heated bond pad on the active surface of the semiconductor die to alloy the metallic elements of the wire and the bond pad, thereby bonding the wire to the bond pad in a ball-type wire bond. In some instances, ultrasonic vibration of the bonding capillary may be used during the bonding process. After the bonding of the wire to the bond pad on the active surface of a semiconductor die, the bonding capillary tool is moved to a bonding site on the desired lead finger of the lead frame. The wire is pressed against the heated lead finger of the lead frame to bond the wire to the lead finger. The bond wire is then tensioned by the bonding capillary until the wire is sheared, making a stitch- or wedge-type wire bond on the lead finger. The bonding process is repeated for the desired bond pads on the active surface of the semiconductor die for connections to the desired lead fingers of the lead frame.

One type of wire bonding capillary design is illustrated in U.S. Pat. No. 4,415,115. The bonding capillary tip is formed having a flat bonding surface and an annular cutting ridge raised from the flat bond surface surrounding the aperture through which the wire is fed in the bonding capillary. Alternately, the cutting ridge may comprise a semicircle shape rather than an annular shape.

Another type of wire bonding capillary is illustrated in U.S. Pat. No. 5,421,503. The bonding capillary is for use in automatic gold ball bonders for bonding fine gold wires onto closely spaced bond pads on semiconductor devices. The bonding capillary comprises a cylindrical body portion which fits into an ultrasonic transducer having a bottle-neck working tip on the other end of the body portion. The working tip includes a working face comprising an annular ring between the chamfer diameter of the working tip and the working tip diameter and a face angle of approximately 22 degrees plus or minus 3 degrees.

Yet another wire bonding capillary is illustrated in U.S. Pat. No. 5,662,261. The wire bonding capillary includes a working tip having an elongated hole therethrough and a face extending away from the hole at multiple angles of increasing magnitude.

While the size of semiconductor devices continues to decrease and the number of bond pads on the active surface continues to increase, having smaller pitch between adjacent bond pads and the width of lead fingers of lead frames decreases, it is necessary to have a wire bonding capillary which will form effective ball-type wire bonds on the bond pads of the semiconductor device and stitch- or wedge-type wire bonds on the lead fingers of the lead frame having acceptable pull-off strength characteristics without damaging the circuitry of the semiconductor device. Such requirements illustrate the need for a wire bonding capillary which will effectively make a ball-type wire bond on the bond pad of the semiconductor device without contacting the surface of the semiconductor device adjacent thereto and will effectively make stitch- or wedge-type wire bonds on the lead fingers of lead frames.

BRIEF SUMMARY OF THE INVENTION

The present invention relates to an improved wire bonding capillary used in the bonding of wires to the bond pads of a semiconductor device and the leads of a lead frame. The wire bonding capillary has a working tip having a working surface including a flat annular portion surrounding the wire feed aperture in the capillary and a concave surface extending therefrom to the intersection with the radius extending from the external tip diameter of the working tip.

DETAILED DESCRIPTION OF THE INVENTION

Figure 1:
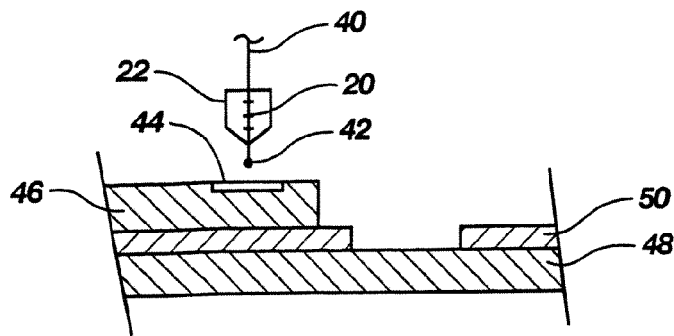
FIGS. 1 through 4 are cross-sectional views showing the steps of a typical wire bonding operation.
Figure 2:
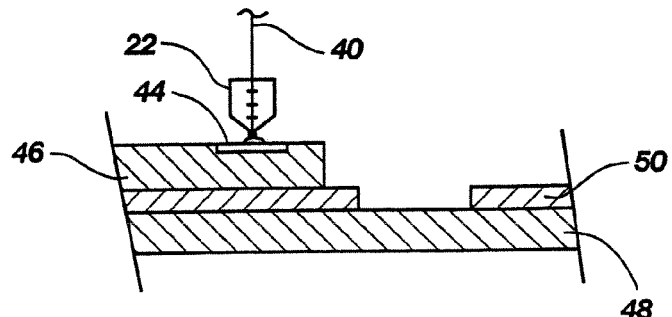
Figure 3:
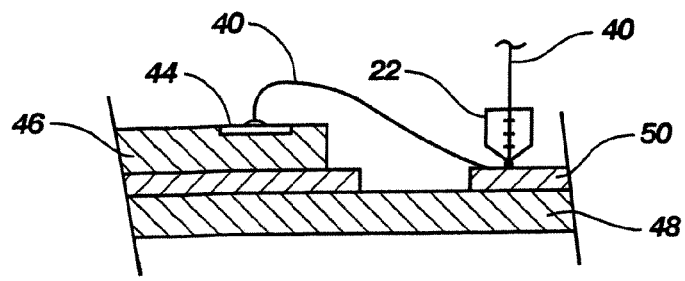

Referring to drawing FIGS. 1 through 4, a typical wire bonding operation using a capillary is illustrated. A wire 40, typically of gold or copper, is threaded through a hole 20 in the capillary tip 22. The end of wire 40 is heated by an electrical discharge or a hydrogen torch to a molten state, thereby forming a ball 42 of molten metal on the end of wire 40. Capillary tip 22 is lowered toward bond pad 44 on the active surface of a semiconductor device 46. The bond pad 44 is typically of aluminum or has an aluminum layer thereon. However, the bond pad 44 may be of any suitable conductive metal. The semiconductor device 46 is heated to a temperature of 150° C. to 350° C. by a heated block 48. Molten metal ball 42 is pressed by the capillary tip 22 against the heated bond pad 44 to alloy the metallic elements of the wire 40 and bond pad 44, thereby bonding the wire 40 to the bond pad 44. In some instances, ultrasonic vibrations are applied to the capillary tip 22 as the molten metal ball 42 on the end of wire 40 is pressed against the bond pad 44.

Figure 4:
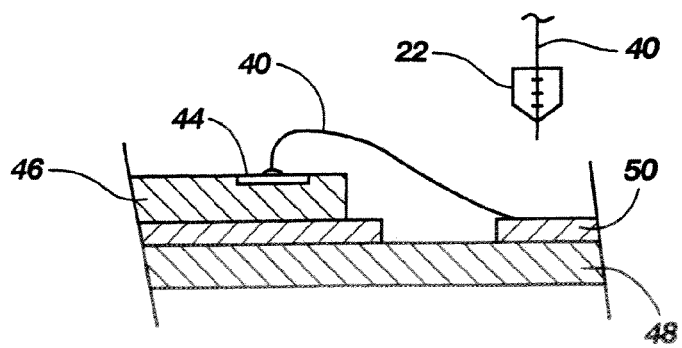

Referring specifically to drawing FIG. 4, capillary tip 22 is then raised, causing the wire 40 to feed through the aperture in the capillary tip 22 and moved to a bonding site on a lead finger 50 of a lead frame. The lead finger 50 is heated to a temperature of 150° C. to 350° C. by heated block 48. The wire 40 is pressed against the heated lead finger 50 to alloy the metallic elements of wire 40 and lead finger 50, thereby bonding the wire 40 to the lead finger 50. If desired, ultrasonic vibrations may be applied to the capillary tip 22 as wire 40 is pressed against lead finger 50. The face of the capillary tip 22 severs the wire 40 to form a stitch-type wire bond of the wire 40 to the lead finger 50, thereby allowing the capillary tip 22 to be used to repeat the process with respect to other bond pads 44 on the active surface of the semiconductor device 46 and lead fingers 50 of the lead frame, depending upon the uniformity of the thickness of the coatings 49 and/or 47 (FIG. 5) on the semiconductor device 46.

Figure 5:
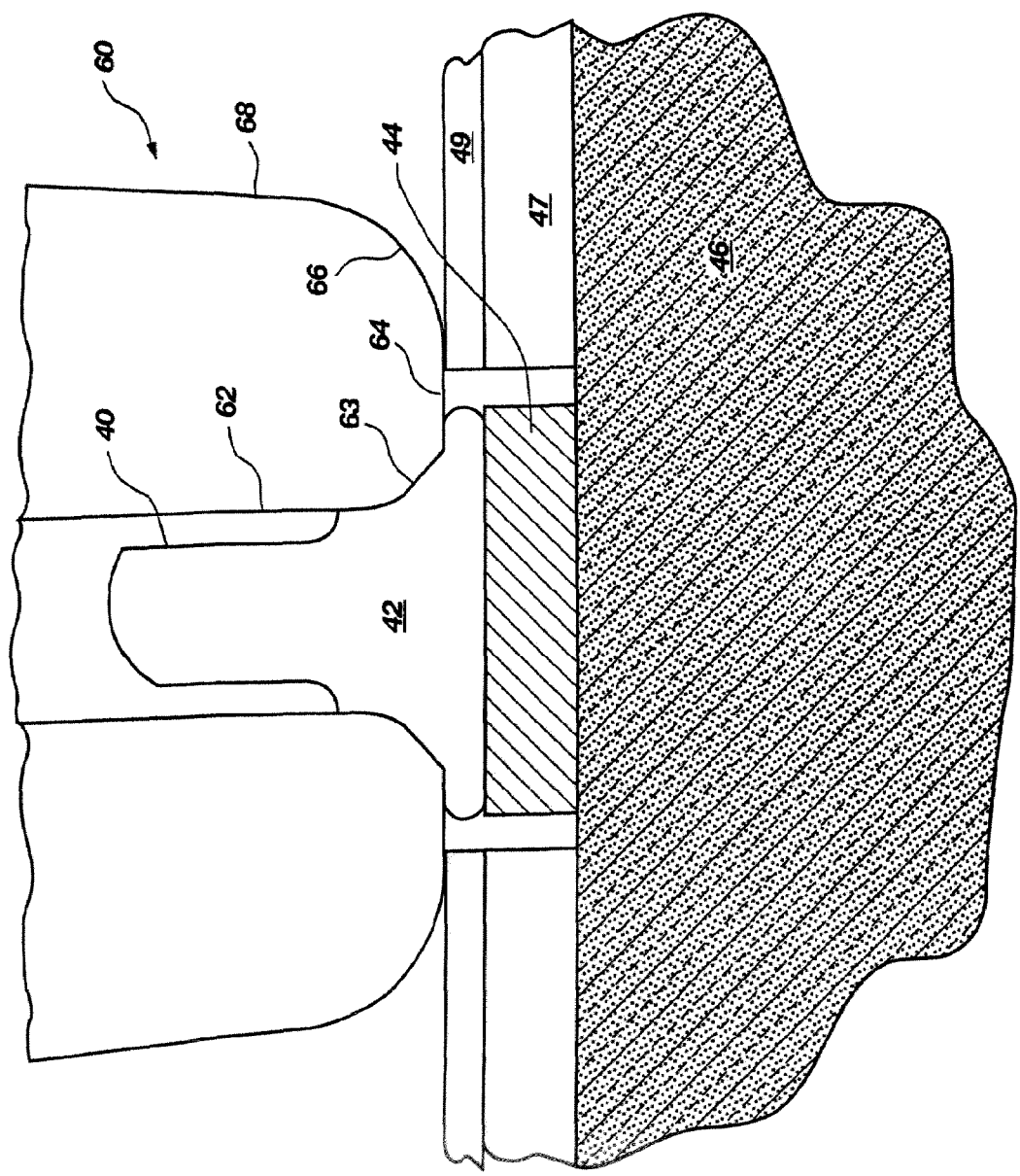
FIG. 5 is a cross-sectional view of a prior art working tip of a wire bonding capillary having a flat surface thereon.

Referring to drawing FIG. 5, the tip portion of a prior art wire bonding capillary 60 is illustrated forming a molten metal ball 42 on the bond pad 44 of a semiconductor device 46 having a first coating 47 thereon and a second coating 49 over the first coating 47. The tip portion of the wire bonding capillary 60 includes a central aperture 62 having a frusto-conical surface 63 at the lower end of the aperture, a flat annular surface 64 extending from the frustoconical surface 63 to an annular curved surface 66 which terminates in the outer surface 68 of the tip. The frustoconical surface 63 and flat annular surface 64 help to form the required wire bonds to the bond pad 44 and lead finger (not shown) of a lead frame. However, the flat annular surface 64 may contact the second coating 49 on the semiconductor device 46 during the bonding of the molten metal ball 42 of the wire 40 to the bond pad 44, causing damage to the semiconductor device 46.

Figure 6:
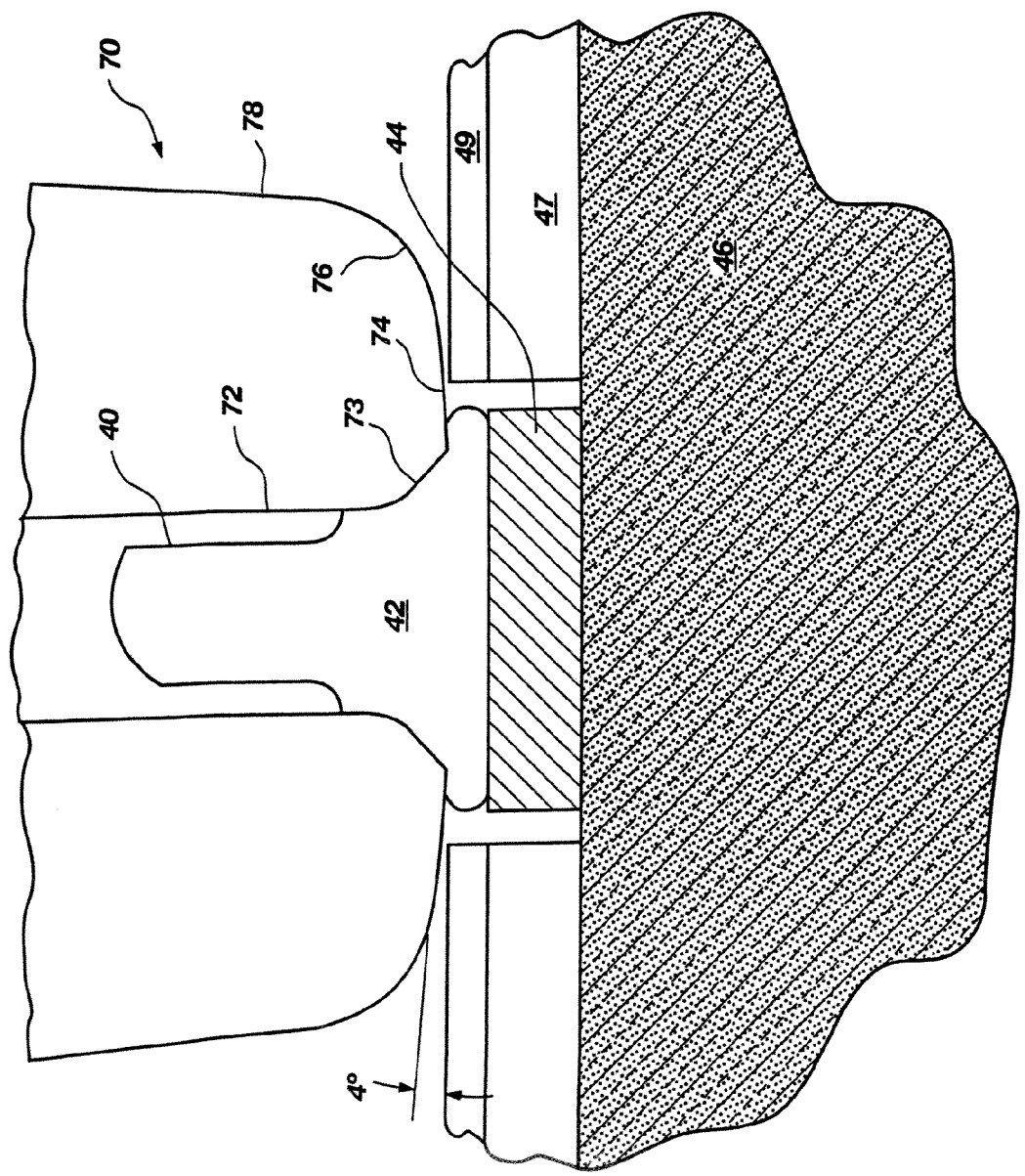
FIG. 6 is a cross-sectional view of a prior art working tip of a wire bonding capillary having an angled surface thereon.

Referring to drawing FIG. 6, the tip portion of a prior art wire bonding capillary 70 is illustrated forming a molten metal ball 42 on the bond pad 44 of a semiconductor device 46 having a first coating 47 thereon and a second coating 49 over the first coating 47. The tip portion of the bonding capillary 70 includes a central aperture 72 having a first frustoconical surface 73 at the lower end of the central aperture 72, a second frustoconical surface 74 extending from the first frustoconical surface 73 to an annular curved surface 76 which terminates in the outer surface 78 of the tip. The first frustoconical surface 73 and second frustoconical surface 74 help to form the required wire bonds to the bond pad 44 and lead finger (not shown) of a lead frame. The second frustoconical surface 74 is formed generally at an angle of four degrees (4°) with respect to a horizontal plane extending through the upper surface of the second coating 49 on the semiconductor device 46. However, the second frustoconical surface 74 may contact the second coating 49 on the semiconductor device 46 during the bonding of the molten metal ball 42 of the wire 40 to the bond pad 44, causing damage to the semiconductor device 46, depending upon the uniformity of thickness of the coating 49 and/or 47 on the semiconductor device 46.

Figure 7:
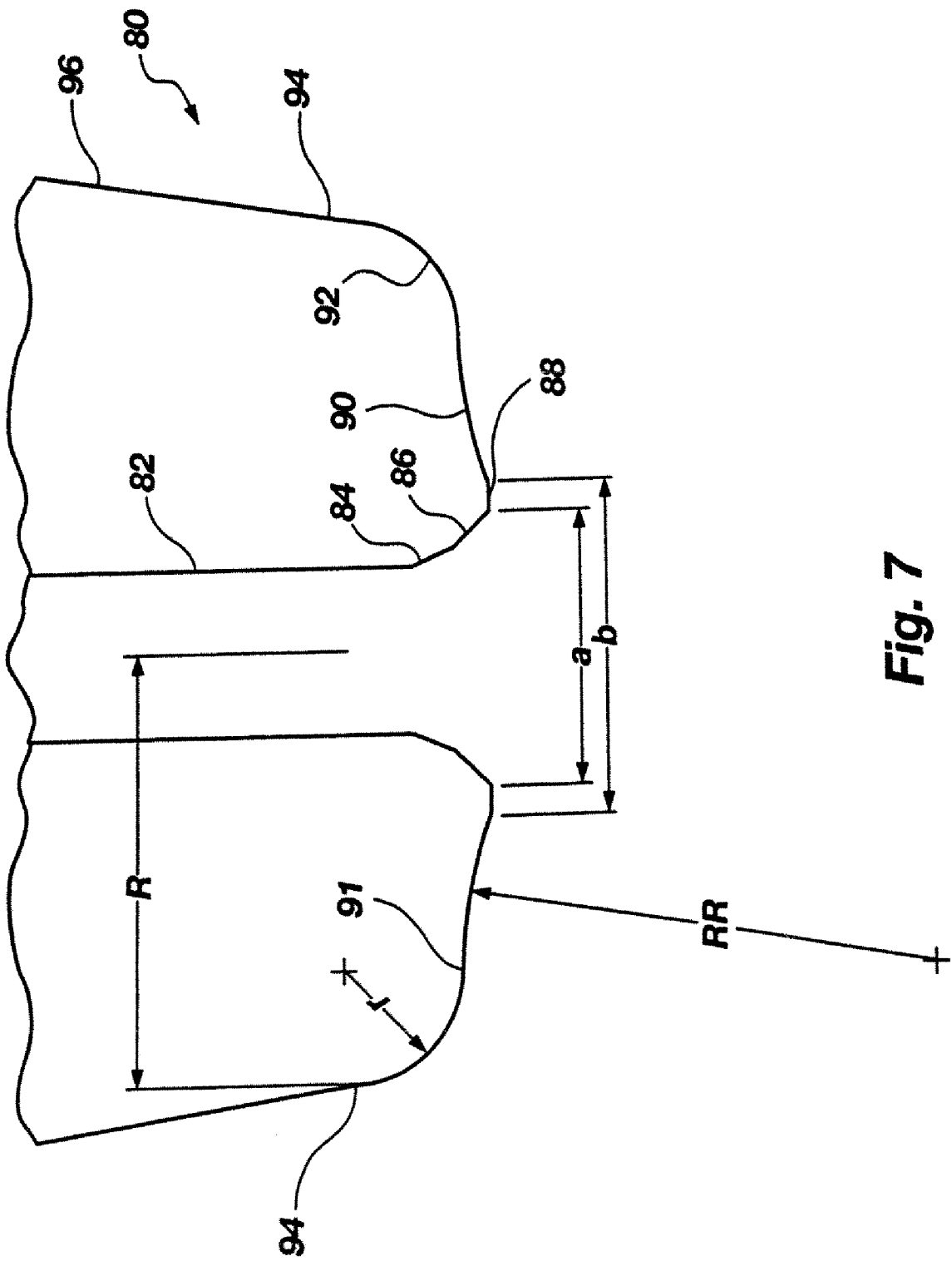
FIG. 7 is a cross-sectional view of a working tip of a wire bonding capillary of the present invention.

Referring to drawing FIG. 7, the tip of a wire bonding capillary 80 of the present invention is illustrated. The tip portion of the wire bonding capillary 80 includes a central aperture 82 having a first frustoconical surface 84 and second frustoconical surface 86 extending from the lower end of the first frustoconical surface 84, both located at or near the lower end of the central aperture 82, and, on the lower surface of the tip, a flat annular surface 88 extending for a distance between diameter "a" to diameter "b" of the tip from the second frustoconical surface 86 of the central aperture 82 and a face having an annular concave surface 90 extending from the diameter "b" of the flat annular surface 88 into the tip and outwardly a distance to a point of inflection (tangency) 91 to an annular curved surface 92 defined by a radius "r" of curvature of the tip, which, in turn, intersects at point 94, the lower annular radial diameter "R" of the wire bonding capillary 80, with the annular conical outer surface 96 of the tip. A radius of curvature "RR" is used for the formation of the annular concave surface 90, the size of the radius "RR" determining the degree of curvature of the annular concave surface 90 for the relative clearance between the tip of the wire bonding capillary 80 and a second coating 49 on the surface of the semiconductor device 46. The first frustoconical surface 84 and second frustoconical surface 86 of the central aperture 82 and the flat annular surface 88 help to form the required wire bonds to the bond pad 44 and lead finger (not shown) of a lead frame. The flat annular surface 88 of the lower surface of the tip is used to sever the wire 40 during the formation of a stitch- or wedge-type wire bond on the lead finger (not shown) of a lead frame during the wire bonding process. The width of the flat annular surface 88 is determined by the size of the bond pad 44 of the semiconductor device upon which the wire bonding capillary 80 is to be used.

Figure 8:
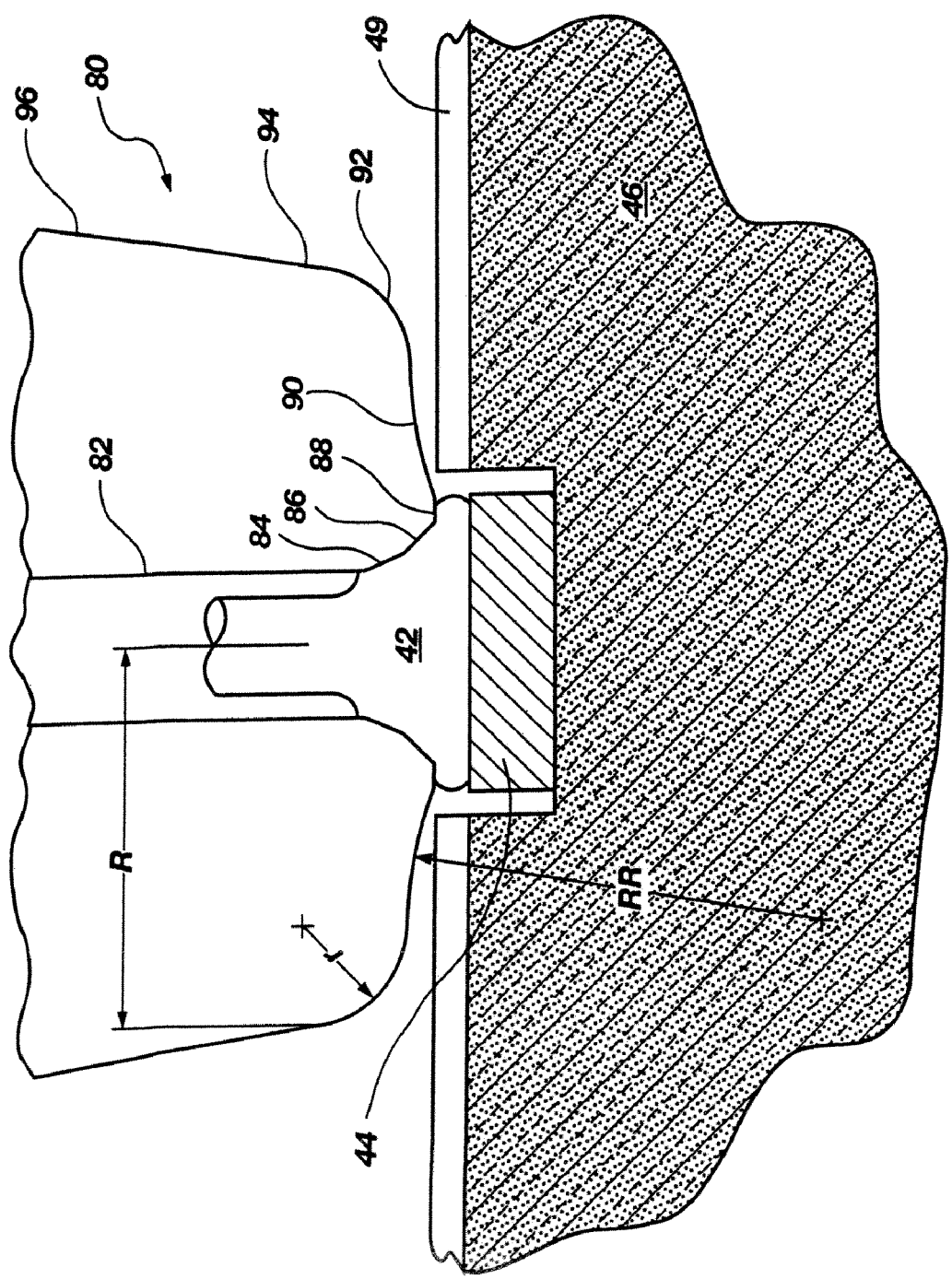
FIG. 8 is a cross-sectional view of a working tip of a wire bonding capillary of the present invention making a ball-type wire bond on a bond pad of a semiconductor device.

Referring to drawing FIG. 8, the tip of a wire bonding capillary 80 of the present invention is illustrated in relation to a semiconductor device 46 having a second coating 49 and a bond pad 44 on the active surface thereof. The first frustoconical surface 84, second frustoconical surface 86, and flat annular surface 88 form the molten metal ball 42 with the bond pad 44, the annular concave surface 90 providing clearance with the second coating 49 on the active surface of the semiconductor device 46 to prevent contact of the tip of the wire bonding capillary 80.

Figure 9:
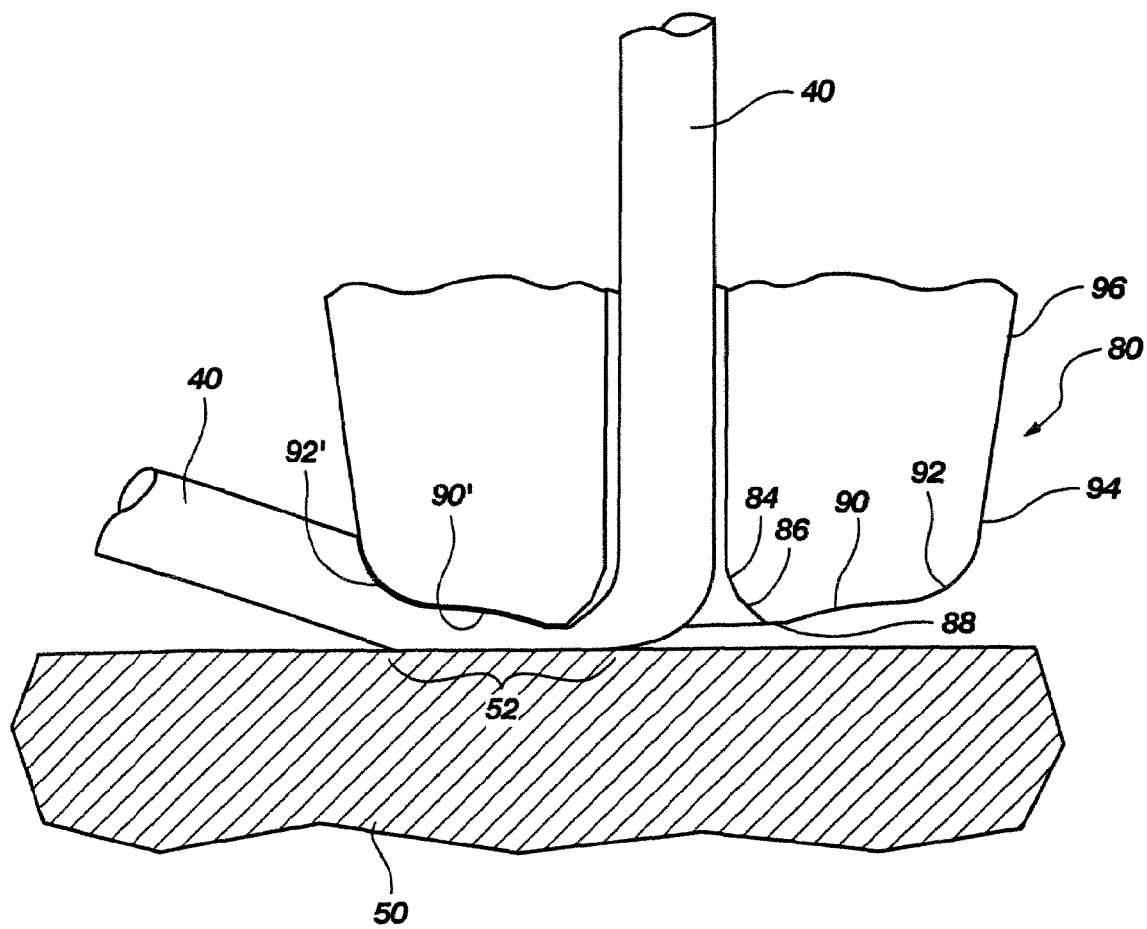
FIG. 9 is a cross-sectional view of a working tip of a wire bonding capillary of the present invention making a stitch- or wedge-type bond on a lead finger of a lead frame.

Referring to drawing FIG. 9, the wire bonding capillary 80 of the present invention is illustrated in conjunction with a lead finger 50 of a lead frame. The wire 40 is bonded in the bond area 52 of the lead finger 50 by the wire bonding capillary 80 with the flat annular surface 88, annular concave surface 90, and annular curved surface 92 of the tip deforming the wire 40 into engagement with a portion of the lead finger 50. The flat annular surface 88 of the wire bonding capillary 80 is used to sever the wire 40 after the bonding thereof to the lead finger 50. The annular concave surface 90 and annular curved surface 92 of the wire bonding capillary 80 are used in conjunction with the flat annular surface 88 thereof to form the bond area 52 of the connection of the wire 40 to the lead finger 50, the bond area 52 having a convex portion 90' which is formed by annular concave surface 90 of the tip of wire bonding capillary 80 and a curved portion 92' which is formed by the annular curved surface 92 of the tip of wire bonding capillary 80. The flat annular surface 88, annular concave surface 90, and annular curved surface 92 provide a gradual transition between the wedge deformity of the wire 40 and the existing circular shape of the wire 40 extending beyond the bond area 52, the wire 40 being heated by suitable means before the formation of the stitch- or wedge-type bond on the lead finger 50 while the lead finger 50 is heated before the formation of the wire bond thereto.

From the foregoing, it is apparent that changes, modifications, and deletions may be made to the capillary bonding tool of the present invention which fall within the scope of the invention, for instance, varying the length or size of the radii "r", "R", or "RR" and the radial dimensions of the flat annular surface 88 between the dimensions "a" and "b."

What is claimed is:

1. An apparatus having a portion thereof used to attach metal to another metal comprising:
   a nozzle including:
      a capillary tip having a substantially horizontal annular surface extending from an annular opening, the nozzle extending concavely from an exterior of the substantially horizontal annular surface extending from the annular opening providing an annular surface around the nozzle free of contact by the capillary tip of the apparatus during a bonding operation used to attach metal to another metal.

2. The apparatus of claim 1, further comprising:
   the nozzle including a first frustoconical surface at an end thereof and a second frustoconical surface connected to the first frustoconical surface and connected to the substantially horizontal annular surface on the nozzle.

3. The apparatus of claim 2, further comprising:
   an annular curved surface intersecting a concave surface extending from the annular curved surface.

4. The apparatus of claim 1, further comprising:
   the nozzle having a first frustoconical surface at the end thereof, a second frustoconical surface connected to the first frustoconical surface and connected to the substantially horizontal annular surface on the capillary tip, and an annular curved surface intersecting a concave surface extending from the annular curved surface.

5. The apparatus of claim 1, further comprising:
   the nozzle having a first frustoconical surface at the end thereof;
   the capillary tip having a second frustoconical surface connected to the first frustoconical surface and connected to the substantially horizontal annular surface on the capillary tip; and
   an annular curved surface intersecting a concave surface extending from the substantially horizontal annular surface, the annular curved surface intersecting the concave surface at a point of tangency therewith.

6. The apparatus of claim 4, wherein the annular curved surface is formed by a radius.

7. An apparatus for connecting wire to a work-piece comprising:
   a capillary tip having a flat annular surface having an annular opening, a nozzle extending concavely from an exterior of the flat annular surface of the annular opening providing an annular surface around the nozzle free of contact with the work-piece during a bonding operation and an annular curved surface intersecting a concave surface extending from the annular curved surface.

8. The apparatus of claim 7, further comprising:
   the nozzle having a first tapered surface at an end thereof and a second tapered surface connected to the first tapered surface and connected to the flat annular surface of the annular opening of the nozzle.

9. The apparatus of claim 7, further comprising:
   the nozzle having a first tapered surface at an end thereof and a second tapered surface connected to the first tapered surface and connected to the flat annular surface on the capillary tip.

\* \* \* \* \*